United States Patent
Lu et al.

(10) Patent No.: US 9,414,480 B2
(45) Date of Patent: Aug. 9, 2016

(54) POWER CONVERSION DEVICE AND POWER CONVERSION ASSEMBLY

(71) Applicant: Delta Electronics (Shanghai) Co., Ltd., Shanghai (CN)

(72) Inventors: Xing-Xian Lu, Shanghai (CN); Pei-Ai You, Shanghai (CN); Gang Liu, Shanghai (CN); Jin-Fa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 22 days.

(21) Appl. No.: 14/521,480

(22) Filed: Oct. 23, 2014

(65) Prior Publication Data

US 2015/0146375 A1 May 28, 2015

(30) Foreign Application Priority Data

Nov. 26, 2013 (CN) .......................... 2013 1 0612986

(51) Int. Cl.
| | |
|---|---|
| *H05K 7/20* | (2006.01) |
| *H05K 1/02* | (2006.01) |
| *H05K 7/14* | (2006.01) |
| *H05K 1/18* | (2006.01) |
| *H01L 23/473* | (2006.01) |

(52) U.S. Cl.
CPC .............. *H05K 1/0203* (2013.01); *H05K 1/181* (2013.01); *H05K 7/142* (2013.01); *H05K 7/1432* (2013.01); *H05K 7/209* (2013.01); *H05K 7/2089* (2013.01); *H05K 7/20181* (2013.01); *H05K 7/20863* (2013.01); *H05K 2201/10015* (2013.01)

(58) Field of Classification Search
CPC . G06F 1/181–1/182; H05K 7/20218–7/20381; H05K 7/20409–7/20418; H05K 7/20009–7/20209; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,005,773 A | * | 12/1999 | Rozman | .................. H02M 3/00 361/707 |
| 6,144,557 A | * | 11/2000 | Chen | ..................... H05K 1/141 174/548 |

(Continued)

*Primary Examiner* — Anthony Haughton
*Assistant Examiner* — Razmeen Gafur
(74) *Attorney, Agent, or Firm* — CKC & Partners Co., Ltd.

(57) ABSTRACT

A power conversion device is provided. The power conversion device includes a printed wiring board assembly, a grounding member, and a plurality of insulating struts. The printed wiring board assembly includes a printed circuit board and a plurality of electronic components. The printed circuit board has a plurality of through holes. The electronic components are disposed on the printed circuit board. The insulating struts correspond to the through holes and physically connect and electrically insulate the printed circuit board and the grounding member.

30 Claims, 9 Drawing Sheets

(56) References Cited

U.S. PATENT DOCUMENTS

| | | | | |
|---|---|---|---|---|
| 7,081,691 B2* | 7/2006 | Kawata | H05K 1/0203 | 307/9.1 |
| 7,200,011 B2* | 4/2007 | Fronk | H05K 7/209 | 361/718 |
| 7,760,505 B2* | 7/2010 | Meier | H01L 23/3735 | 257/712 |
| 2001/0030037 A1* | 10/2001 | Hellbruck | H01L 23/4093 | 165/80.3 |
| 2002/0054480 A1* | 5/2002 | Jitaru | H01F 27/06 | 361/704 |
| 2002/0135981 A1* | 9/2002 | Pautsch | H01L 23/4735 | 361/700 |
| 2002/0141161 A1* | 10/2002 | Matsukura | H01L 23/4006 | 361/713 |
| 2003/0151893 A1* | 8/2003 | Meyer | H02M 1/44 | 361/688 |
| 2004/0218375 A1* | 11/2004 | Fronk | H05K 7/209 | 361/813 |
| 2005/0135065 A1* | 6/2005 | Nakatsu | H01L 23/4006 | 361/703 |
| 2006/0232940 A1* | 10/2006 | Smirra | H05K 7/1418 | 361/707 |
| 2007/0115643 A1* | 5/2007 | Chen | H01L 23/4006 | 361/719 |
| 2007/0139896 A1* | 6/2007 | Yamada | H01L 23/34 | 361/720 |
| 2007/0165376 A1* | 7/2007 | Bones | H01L 25/162 | 361/688 |
| 2008/0101030 A1* | 5/2008 | Li | H01L 23/4093 | 361/719 |
| 2008/0144290 A1* | 6/2008 | Brandt | B60R 16/0239 | 361/720 |
| 2008/0198548 A1* | 8/2008 | Nakamura | H05K 7/20927 | 361/689 |
| 2008/0217757 A1* | 9/2008 | Meier | H01L 23/3735 | 257/691 |
| 2009/0021916 A1* | 1/2009 | Stolze | H01L 21/50 | 361/709 |
| 2009/0185352 A1* | 7/2009 | Ellsworth | H05K 1/0204 | 361/720 |
| 2010/0091464 A1* | 4/2010 | Ohnishi | H01L 23/053 | 361/723 |
| 2010/0314073 A1* | 12/2010 | Zhao | H01L 23/4093 | 165/80.3 |
| 2011/0044001 A1* | 2/2011 | Olesen | H01L 23/473 | 361/703 |
| 2012/0113596 A1* | 5/2012 | Miyoshi | H05K 1/0203 | 361/707 |
| 2012/0129298 A1* | 5/2012 | Lin | H01L 25/16 | 438/118 |

* cited by examiner

POWER CONVERSION DEVICE AND POWER CONVERSION ASSEMBLY

RELATED APPLICATIONS

This application claims priority to Chinese Application Serial Number 201310612986.3, filed Nov. 26, 2013, which are herein incorporated by reference.

BACKGROUND

In recent years, electric vehicles have achieved significant improvements in core technologies and have been gradually entering the stage of practical use and small scale industrialization.

The OBCM (on board charge module) is a key component of an electric vehicle and is an electronic device mounted on the electric vehicle for charging battery packs. The OBCM uses input wires to receive alternating current from the AC power grid, and outputs a high voltage direct current to charge the high voltage battery pack mounted in the electric vehicle. Moreover, the OBCM uses a communication port to maintain real-time interactive communications with a battery management system (BMS).

In the miniature trend, the space occupied by the printed wiring board assembly (a key component of the OBCM) in the heat-dissipating base is intended to be reduced as much as possible. As a result, the printed wiring board assembly may become so close to any surface of the heat-dissipating base, and a short circuit of the printed wiring board assembly may happen because current heat-dissipating bases are often designed as a ground member. Under a severe short circuit, the power conversion assembly may be totally damaged, resulting in a cost burden of the industry. The OBCM is mounted on the vehicle, so it often faces different challenging environments such as high temperature, high humidity, strong vibrations, and dramatic changes of the environment temperature. Therefore, how to avoid the short circuit of the power conversion assembly and the heat-dissipating base due to collisions or vibrations in the vehicles becomes an important issue.

SUMMARY

This disclosure provides a power conversion device and a printed wiring board assembly.

In one embodiment, a power conversion device is provided. The power conversion device includes a printed wiring board assembly, a grounding member, and a plurality of insulating struts. The printed wiring board assembly includes a printed circuit board and a plurality of electronic components. The printed circuit board has a plurality of through holes. The electronic components are disposed on the printed circuit board. The insulating struts correspond to the through holes and physically connect and electrically insulate the printed circuit board and the grounding member.

In another embodiment, a printed wiring board assembly is provided. The printed wiring board assembly includes a printed circuit board, a plurality of electronic components, and a restricting member. The electronic components are disposed on the printed circuit board. The restricting member has a body and an opening disposed in the body. The electronic components are disposed in the opening.

In another embodiment, a power conversion device is provided. The power conversion device includes a printed circuit board, a plurality of first electronic components, a restricting member, and a heat-dissipating member. The first electronic components are disposed on the printed circuit board. The restricting member has a body and an opening disposed in the body. The first electronic components are disposed in the opening. The heat-dissipating member is fixed to the printed circuit board and is electrically insulated from the restricting member.

By using the insulating struts or the restricting member to fix the printed wiring board assembly and the heat-dissipating base, the electronic insulation of the printed wiring board assembly and the heat-dissipating base is achieved by the insulating struts or the coordination of the restricting member, the insulating struts (or the coupling portions), etc. The first connecting part and the second connecting part are electrically insulated by the plastic part. Therefore, even when electronic components on the printed wiring board assembly accidentally touch screws, the electronic components are electrically insulated from the heat-dissipating base as the ground member due to the insulating of the plastic part, and the electronic components may not be damaged due to a short circuit. In addition, because of the protection of the restricting member, pin feet of the electronic components connected to the printed wiring board assembly don't fracture. Therefore, the reliability of the power conversion device is improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

In current power conversion devices, a printed wiring board assembly is usually fixed to a heat-dissipating base usually via metal standoffs and screws. The heat-dissipating base includes a conductive block with a large area, so the heat-dissipating base has a grounding effect and may be viewed as a grounding member. However, because the standoffs and the screws are conductive, a certain distance must be maintained between the standoffs and the screws and electronic components on the printed wiring board assembly. Therefore, the electronic connection between the electronic components and the heat-dissipating base is avoided, and the reliability of the power conversion device is ensured. However, the described deposition violates the miniature approach, so an insulating device to fix the printed wiring board assembly and the grounding member is provided. In other words, by using the insulating struts or the restricting member to fix the printed wiring board assembly and the grounding member such as the heat-dissipating base or heat-dissipating member, the electronic insulation of the printed wiring board assembly and the grounding member is achieved by the insulating struts or the coordination of the insulating struts (or the coupling portions), the restricting member, etc. The power conversion device may be used in electric vehicles or may be used as a vehicle power conversion device or an on board charger module (OBCM) to achieve the safety, the reliability, and the miniature of the power conversion device.

Figure 1:
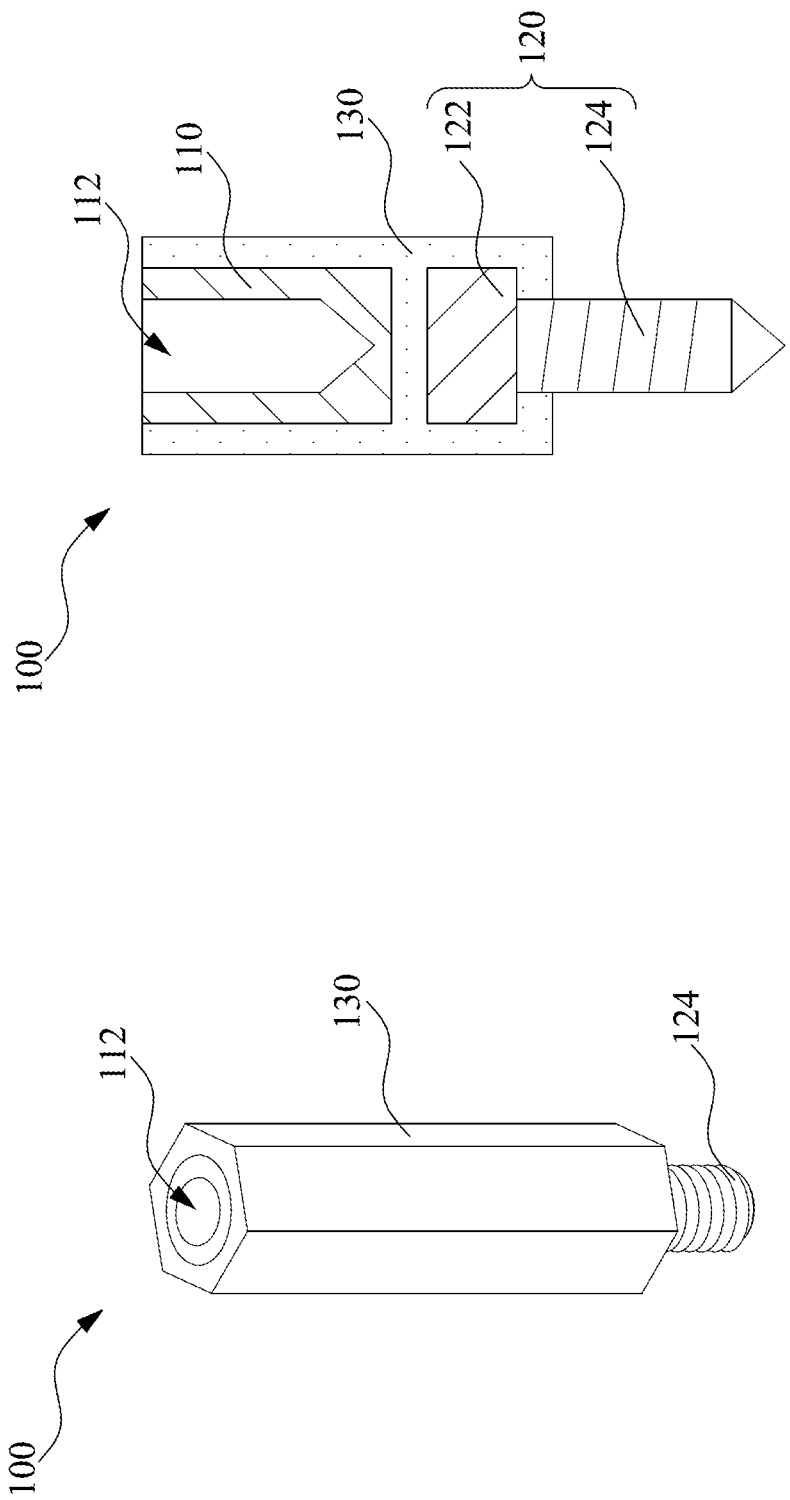
FIG. 1A is a perspective view of an insulating strut used by a power conversion device according to one embodiment of this invention.
FIG. 1B is an exploded cross-sectional view of the insulating strut used by the power conversion device according to one embodiment of this invention.

FIG. 1A is a perspective view of an insulating strut 100 used by a power conversion device according to one embodiment of this invention. FIG. 1B is an exploded cross-sectional view of the insulating strut 100 used by the power conversion device according to one embodiment of this invention. As shown in FIG. 1A and FIG. 1B, an insulating strut 100 is provided. The insulating strut 100 includes a first connecting part 110, a second connecting part 120, and a plastic part 130 partially covering the first connecting part 110 and the second connecting part 120. The first connecting part 110 may be connected to the printed wiring board assembly, and the second connecting part 120 may be connected to the grounding member. Therefore, the printed wiring board assembly is fixed to the grounding member via the insulating strut 100.

Specifically, the first connecting part 110 may be a nut, and the second connecting part 120 may be a stud. The second connecting part 120 is fixed to the grounding member, and the printed wiring board is fixed to the first connecting part 110 via a screw. The first connecting part 110 may be a blind-hole nut. The body of the nut is substantially disposed in the plastic part 130, and only an upper surface of the nut is disposed outside the plastic part 130 to expose a screw hole 112 in the nut. The second connecting part 120 is a stud, a head of the stud is disposed in the plastic part 130, and a threaded portion 124 of the stud is disposed outside the plastic part 130 to be fixed to a screw hole on the grounding member.

In order to effectively electrically insulate the printed wiring board assembly and the grounding member, the first connecting part 110 and the second connecting part 120 are separated by the plastic part 130. In other words, though the materials of the first connecting part 110 and the second connecting part 120 are both metal, the two are separated by the plastic part 130 with an insulating material. Therefore, the first connecting part 110 does not directly contact the second connecting part 120 and that an adequate safe distance is maintained.

By using the insulating strut 100 as shown in FIG. 1A and FIG. 1B in the power conversion device, the printed wiring board assembly is fixed to the grounding member, and a short circuit due to electrical connection of the printed wiring board assembly and the grounding member is avoided. Detailed information is provided in the embodiments described below.

Figure 2:
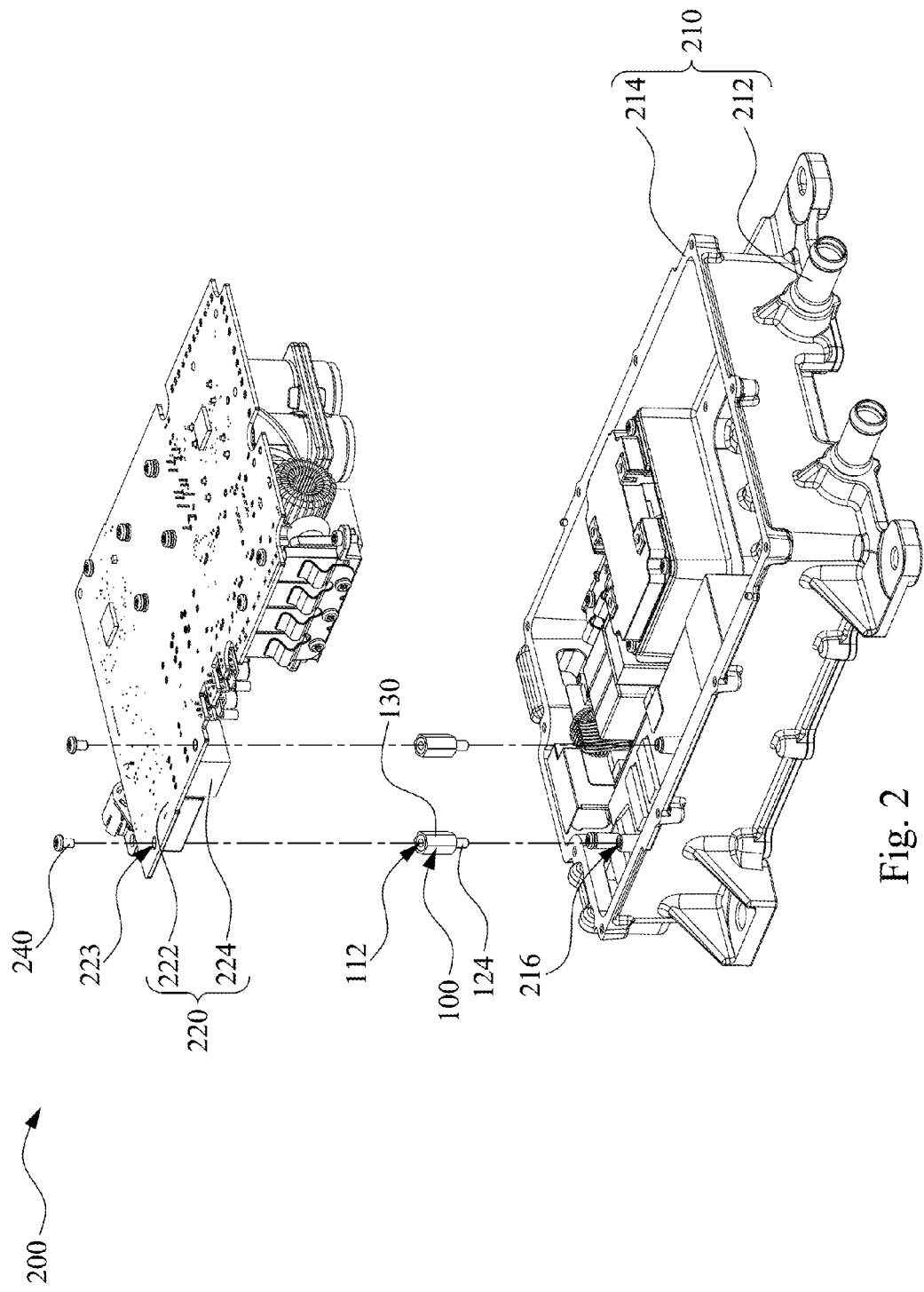
FIG. 2 is an exploded view of the power conversion device according to one embodiment of this invention.

FIG. 2 is an exploded view of the power conversion device 200 according to one embodiment of this invention. As shown in FIG. 2, a power conversion device 200 is provided. The power conversion device 200 includes a heat-dissipating base 210 and a printed wiring board assembly 220. The printed wiring board assembly 220 is fixed to the heat-dissipating base 210 by using the insulating strut 100. In this embodiment, the heat-dissipating base 210 is used as the grounding member. The heat-dissipating base 210 may be a liquid-cooled heat-dissipating unit. The heat-dissipating base 210 includes a fluid passage 212 and a case 214, and the fluid passage 212 is disposed in the case 214. The insulating strut 100 fixes the printed wiring board assembly 220 to the case 214.

The printed wiring board assembly 220 includes a printed circuit board 222 and a plurality of electronic components 224 disposed on the printed circuit board 222. The electronic components 224 disposed on the printed wiring board assembly 220 may thermally contact the heat-dissipating base 210 to exchange heat, and a cooling liquid passes the fluid passage 212 to exchange heat in the heat-dissipating base 210. Therefore, the printed wiring board assembly 220 is cooled. The power conversion device 200 may optically includes a cooling fan to improve the heat-dissipating efficiency.

The material of the case 214 of the heat-dissipating base 210 is usually metal, which has a better heat-dissipating efficiency. Therefore, the case 214 may also be used as the grounding member of the power conversion device 200.

As shown in FIG. 1B and FIG. 2, the first connecting part 110 of the insulating strut 100 may be a nut, and the second connecting part 120 may be a stud. The case 214 of the heat-dissipating base 210 has a plurality of positioning threaded holes 216, and the printed circuit board 222 has a plurality of through holes 223 corresponding to the insulating struts 100. The second connecting part 120 of the insulating strut 100 has a threaded portion 124 disposed outside the plastic part 130. The threaded portion 124 is fixed to the positioning threaded holes 216 to fix the insulating strut 100.

The power conversion device 200 further includes a plurality of screws 240. The first connecting part 110 of the insulating strut 100 has a screw hole 112 disposed outside the plastic part 130. After passing through holes 223 of the printed circuit board 222, the screws 240 is fixed in the screw holes 112 of the insulating struts 100. Therefore, the printed wiring board assembly 220 is fixed to the heat-dissipating base 210.

The insulating strut 100 is used to fix the printed wiring board assembly 220 and the heat-dissipating base 210 and to maintain the insulation between the printed circuit board 222 and the heat-dissipating base 210. In the insulating strut 100, the first connecting part 110 and the second connecting part 120 don't physically contact each other and are electrically insulated by the plastic part 130. Therefore, even when the electronic component 224 of the printed wiring board assembly 220 is electrically connected to the strews 240 connected to the first connecting part 110, the electronic component 224 is not electrically connected to the heat-dissipating base 210 as the grounding member. As a result, a short circuit is avoided.

Figure 3:
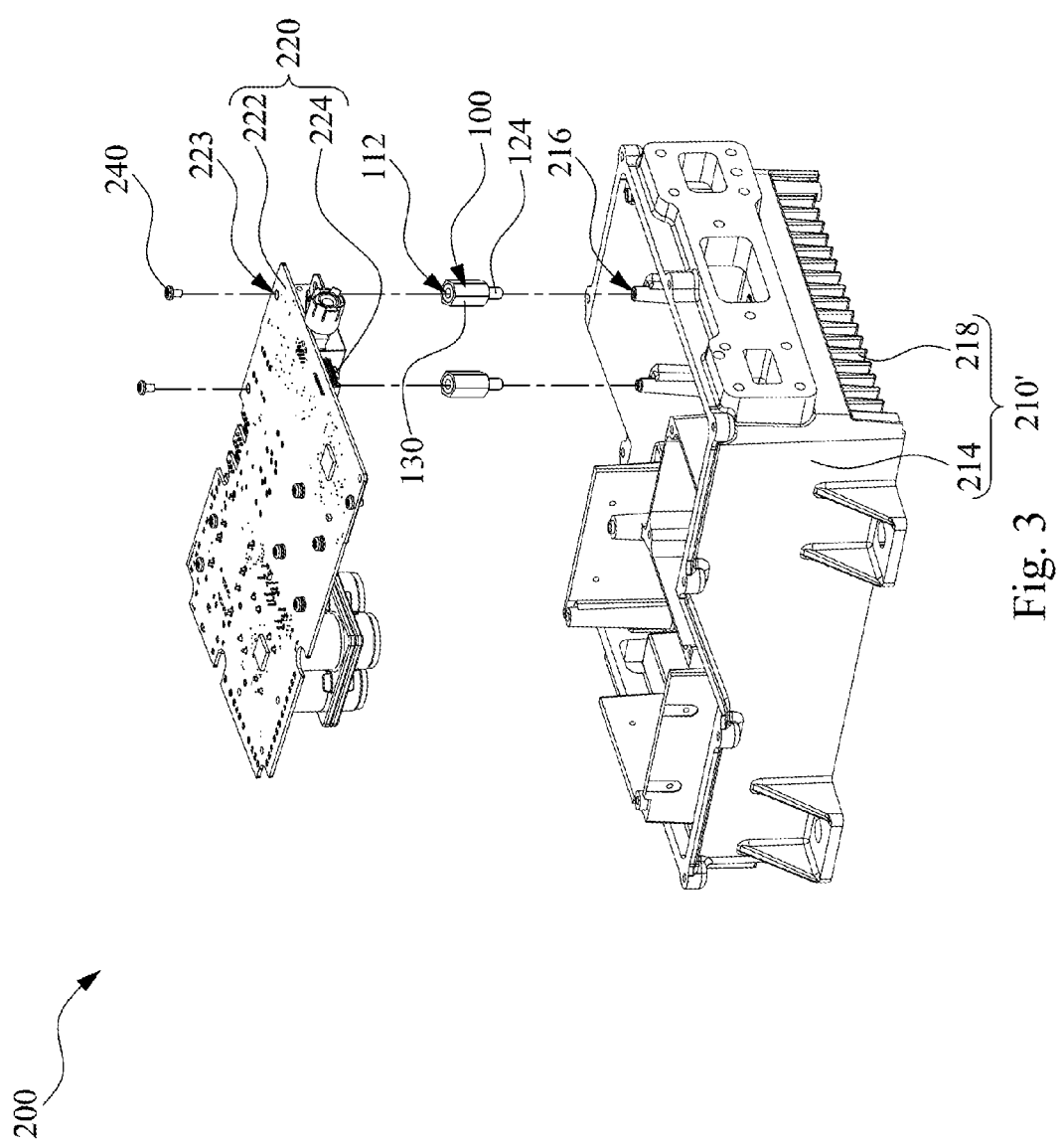
FIG. 3 is an exploded view of the power conversion device according to another embodiment of this invention.

FIG. 3 is an exploded view of the power conversion device 200 according to another embodiment of this invention. As shown in FIG. 3, the power conversion device 200 includes a heat-dissipating base 210', the printed wiring board assembly 220, and the insulating strut 100 to fix and electrically insulate the heat-dissipating base 210' and the printed wiring board assembly 220. The difference between this embodiment and the aforementioned embodiment is that the heat-dissipating base 210' of this embodiment is an air-cooled heat-dissipating unit, and includes a case 214 having positioning threaded holes 216 and a fin set 218 disposed in the case 214 to dissipate heat to the outside air. After the heat generated by the electronic component 224 is transferred to the heat-dissipating base 210', the heat is dissipated by the fin set 218. The power conversion device 200 optionally includes a cooling fan. The cooling fan creates an air flow that passes the fin set 218 to take away the heat in the fin set 218.

As shown in FIG. 1B and FIG. 3, the second connecting part 120 of the insulating strut 100 is fixed to the positioning threaded hole 216 in the case 214, and then the screw 240 passes the through hole 223 in the printed circuit board 222 and is fixed to the first connecting part 110. Therefore, the printed wiring board assembly 220 is fixed to and electrically insulated from the heat-dissipating base 210', and the spacing between the two are maintained.

Figure 4:
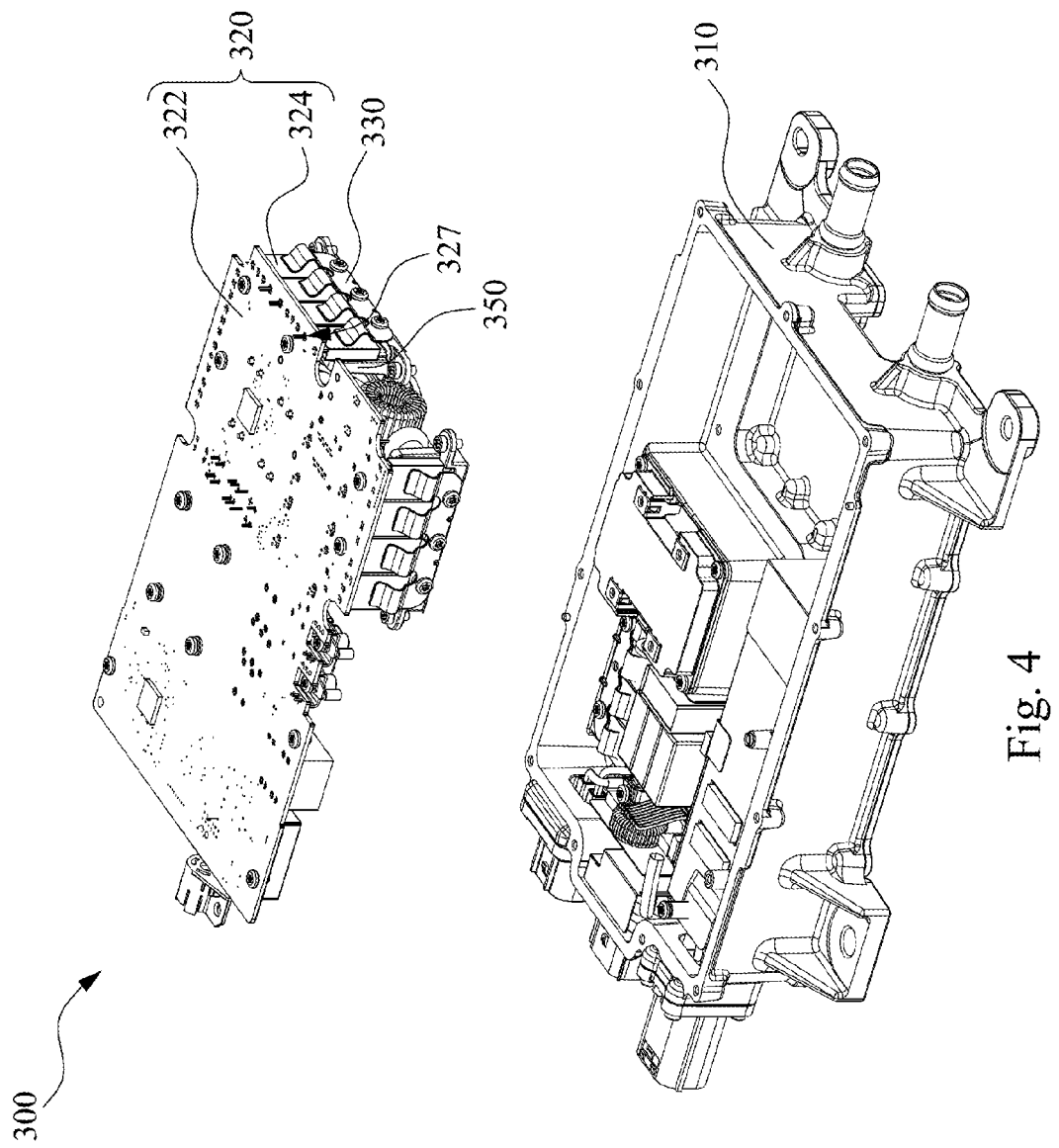
FIG. 4 is an exploded view of the power conversion device according to another embodiment of this invention.

FIG. 4 is an exploded view of the power conversion device 300 according to another embodiment of this invention. As shown in FIG. 4, in order to further save the space in the power conversion device 300, some of the electronic components 324 of the printed wiring board assembly 320 such as power devices are uprightly disposed on the printed circuit board 322, and the power conversion device 300 further includes a champing member 330 to fix the upright electronic components 324. The upright electronic components 324 may be, for example, power devices.

The power conversion device 300 further includes a heat-dissipating member 350. The heat-dissipating member 350 is fixed to the circuit board 322 and contacts the heat-dissipating base 310. The clamping member 330 may be fixed to the heat-dissipating member 350 and the clamping member 330 contacts the heat-dissipating base 310 as well. The electronic component 324 is clamped between the heat-dissipating member 350 and the clamping member 330 and thermally contacts the heat-dissipating member 350 and the clamping member 330. Therefore, the heat generated by the electronic component 324 may be dissipated to the heat-dissipating base 310 by the heat-dissipating member 350 and the clamping member 330 contacted by the electronic component 324. The material of the heat-dissipating member 350 and the clamping member 330 may be a material with a high thermal conductivity, such as metal or high polymers. The heat-dissipating base 310 may be air-cooled or liquid-cooled. The heat-dissipating member 350 may be conductive and is connected to the heat-dissipating base 310, such that the heat-dissipating member 350 and the heat-dissipating base 310 both have the same electric potential and both have the grounding function.

Figure 5:
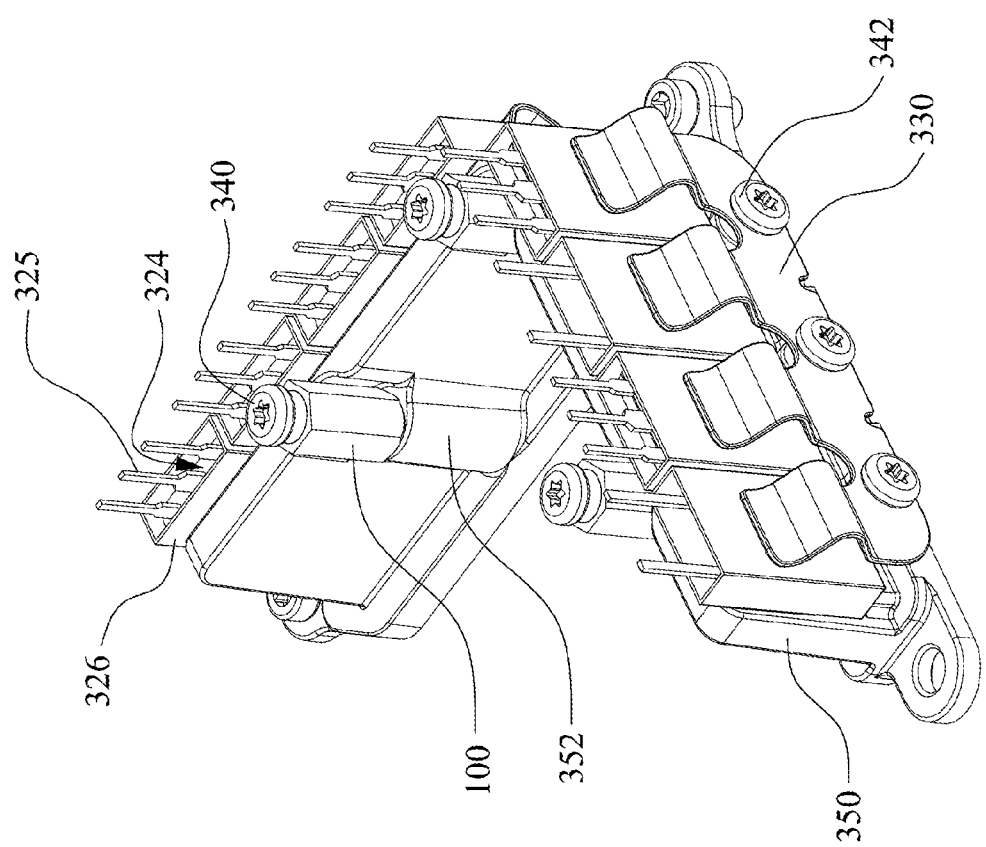
FIG. 5 is a perspective view of electronic components and a clamping member of FIG. 4.

FIG. 5 is a perspective view of electronic components 324 and the clamping member 330 of FIG. 4. As shown in FIG. 4 and FIG. 5, pin feet 325 of the electronic component 324 may be fixed to the through holes 327 of the printed circuit board 322 by methods such as soldering. In the embodiment, a electronic component is disposed inside a cap 326. The cap 326 is clamped between the clamping member 330 and the heat-dissipating member 350, and the heat generated by the electronic components inside the cap 326 may be dissipated to the heat-dissipating base 310 by the heat-dissipating member 350 and the clamping member 330. In one embodiment, the cap 326 is a kind of insulator to ensure the function of isolation and is also a kind of thermally conductive interface material for good conduction.

The printed wiring board assembly 320 may be fixed to the heat-dissipating base 310 and the heat-dissipating member 350 by the insulating struts 100.

Figure 6:
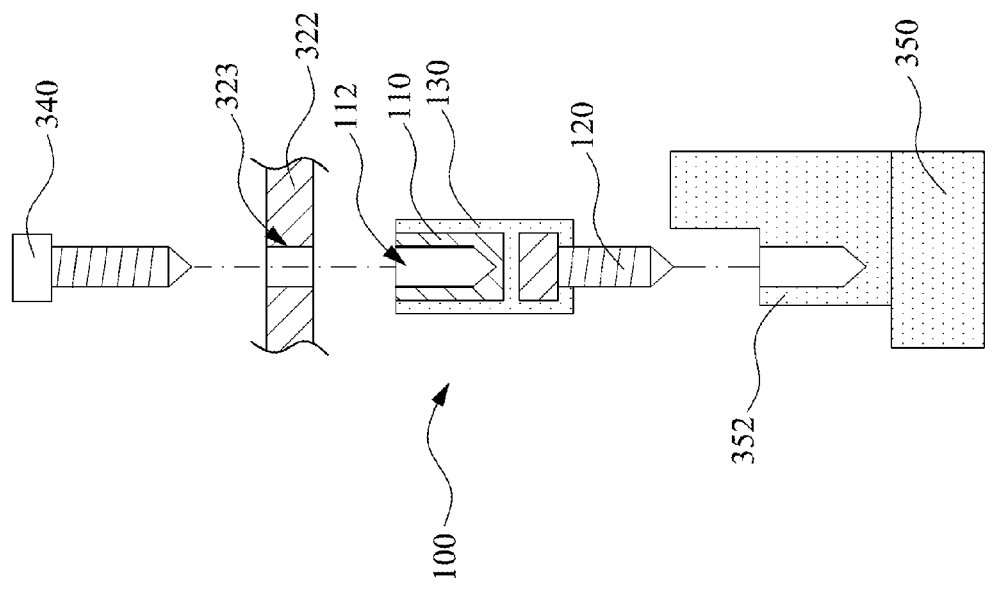
FIG. 6 is a schematic exploded cross-sectional view of FIG. 5.

FIG. 6 is a schematic exploded cross-sectional view of FIG. 5. As shown in FIG. 5 and FIG. 6, the heat-dissipating member 350 has a fixing portion 352. The second connecting part 120 is fixed to the fixing portion 352 of the heat-dissipating member 350, and then the screw 340 passes the through hole 323 on the printed circuit board 322 to be fixed to the first connecting part 110 of the insulating strut 100. The insulating strut 100 is physically connected to the printed circuit board 322, and the plastic part 130 of the insulating strut 100 electrically insulates the printed circuit board 322 and the heat-dissipating member 350 as the grounding member.

Though the first connecting part 110 is a nut and the second connecting part 120 is a stud in the insulating strut 100 of the aforementioned embodiments, people having ordinary skill in the art can make proper modifications to the first connecting part 110 and the second connecting part 120 depending on their actual application. For example, the first connecting part 110 may be a stud, and the second connecting part 120 may be a nut. Or alternatively, the first connecting part 110 and the second connecting part may both be studs or nuts. The first connecting part 110 and the second connecting part 120 may be integrally formed with the plastic part 130 by insert molding. The material of the plastic part 130 may be any insulating high polymers used in insert molding.

Figure 7:
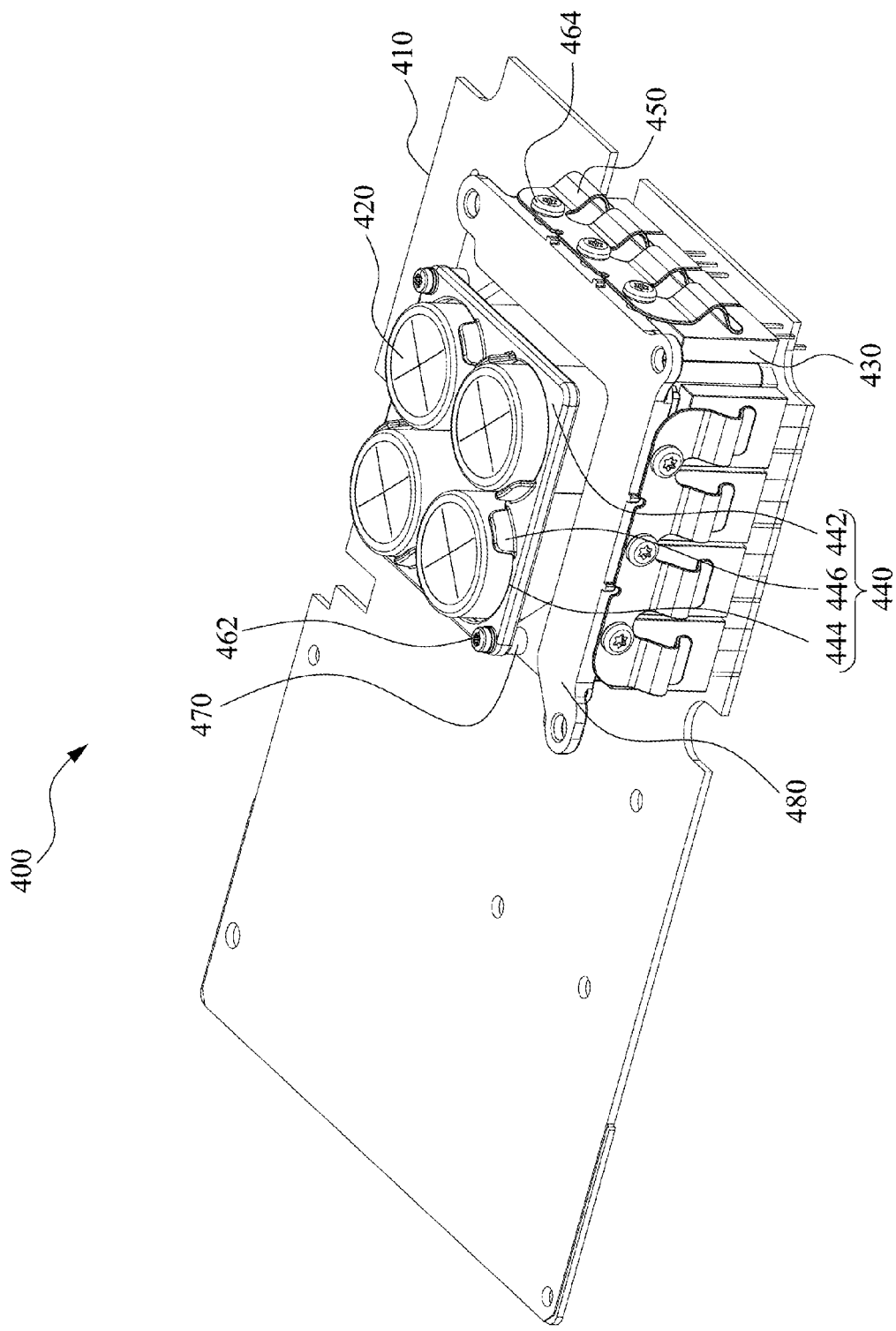
FIG. 7 is a perspective view of a printed wiring board assembly of the power conversion device according to another embodiment of this invention.
Figure 8:
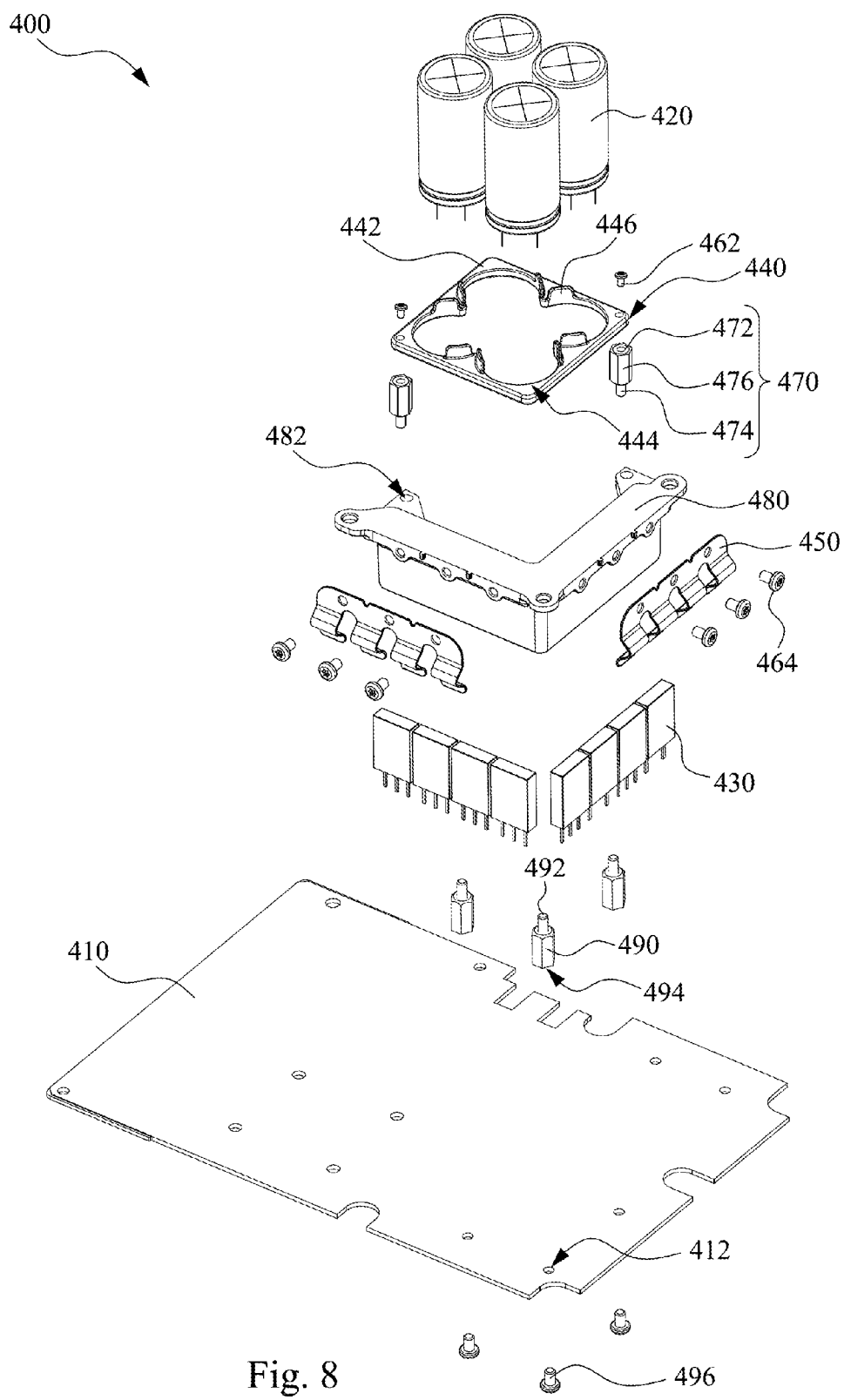
FIG. 8 is an exploded view of the printed wiring board assembly of the power conversion device according to one embodiment of this invention.

FIG. 7 is a perspective view of a printed wiring board assembly 400 of the power conversion device according to another embodiment of this invention. FIG. 8 is an exploded view of the printed wiring board assembly 400 of the power conversion device according to one embodiment of this invention. As shown in FIG. 7 and FIG. 8, the printed wiring board assembly 400 may be assembled with the liquid-cooled heat-dissipating base 210 shown in FIG. 2 or the air-cooled heat-dissipating base 210' shown in FIG. 3. The perspective of the printed wiring board assembly 400 of FIG. 7 and FIG. 8 is different from that in FIG. 2 and FIG. 3.

The printed wiring board assembly 400 includes the printed circuit board 410, a plurality of first electronic components 420, and the restricting member 440. The first electronic components 420 are disposed on the printed circuit board 410. The restriction member 440 fixes the first electronic components 420. Because the printed wiring board assembly 400 is applied in a vehicle power conversion device, the printed wiring board assembly 400 is often subject to large shocks or vibrations. As a result, the pin feet of the first electronic components 420 are easily fractured due to external forces. Therefore, the restricting member 440 is needed to strengthen the connection between the first electronic component 420 and the printed circuit board 410.

For example, the first electronic components 420 may be capacitors, and a group of four of the first electronic components 420 is fixed to the restricting member 440. The restricting member 440 has a body 442 and an opening 444 disposed in the body 442. The shape of the opening 444 corresponds to the fixed first electronic components 420, such as a petal shape corresponding to the group of four of the first electronic components 420. The first electronic components 420 are disposed in the opening 444, and the first electronic component 420 may keep contacting the body 442.

The restriction member 440 further includes a plurality of baffles 446. The baffles 446 are uprightly disposed on the body 442 and on an outer edge of the opening 444. The baffles 446 may be integrally formed with the body 442. For example, the material of the restricting member 440 may be metal, and the restricting member 442 with the opening 444 and the baffles 446 may be obtained by stamping a metal sheet. Or alternatively, the material of the restricting member 440 may be plastic, and the restricting member 442 with the opening 444 and the baffles 446 may be obtained by insert molding.

As shown in FIG. 8, every two of the baffles 446 are disposed opposite to each other and on an edge of the opening 444, and an angle formed between the paired baffles 446 may be 180 degrees. However, this disclosure is not limited to such a configuration. The first electronic component 420 may be fixed between the paired baffles 446. Because the angle formed between the paired baffles 446 is 180 degrees, the capacitor corresponding to the paired baffles 446 is subject to homogeneous forces. Therefore, the capacitors (the first electronic components 420) are not squeezed together and that the pin feet of the capacitors are not damaged. In addition, ends of the baffles 446 distant from the body 442 tilt toward a center of the opening 444, so that a larger opening end is formed at the bottom of the baffles 446 and a smaller opening end is formed at the top of the baffles 446. When the first electronic component 420 is assembled, the first electronic component 420 is first welded to the printed circuit board 410, and then the opening 444 of the restricting member 440 is disposed from the top of the first electronic component 420. Therefore, the first electronic component 420 enters from the side of the larger opening to the side of smaller opening, and the baffles 446 are deformed by the first electronic component 420 and provide elastic forces for clamping the first electronic component 420. The number and the deposition configuration of the baffles 420 are not limited to the aforementioned description. People having ordinary skill in the art can make proper modifications depending on their actual application.

The restricting member 440 may fix the first electronic components 420 in a group to prevent external forces from being directly exerted on the first electronic component 420 and to disperse the external forces, so that the first electronic components 420 is protected. In addition, the restricting member 440 has the baffles 446, and the baffles 446 may fix the first electronic components 420 and provide more support when the first electronic components 420 are subject to external forces to thereby strengthen a bending section modulus of the first electronic components 420. Therefore, fracture will not occur at the pin feet of the first electronic components 420 herein.

The printed wiring board assembly 400 further includes a plurality of second electronic components 430, the heat-dissipating member 480, and the clamping member 450 fixing the second electronic components 430. The material of the heat-dissipating member 480 is metal, and the heat-dissipating member 480 may contact the heat-dissipating base as the grounding member. The heat-dissipating member 480 becomes the grounding member as well. The clamping member 450 is a ripple shaped elastic piece, and the clamping member 450 may be fixed to the heat-dissipating member 480 by the screws 464. The second electronic component 430 is clamped between the clamping member 450 and the heat-dissipating member 480.

To ensure that the first electronic component 420 and the heat-dissipating member 480 are electrically insulated from each other, the restricting member 440 and the heat-dissipating member 480 may be electrically insulated from each other, especially when the material of the restricting member 440 is metal.

In this embodiment, the restricting member 440 is fixed to the heat-dissipating member 480 by the insulating strut 470. The insulating strut 470 includes the first connecting part 472, the second connecting part 474, and the plastic part 476 partially covering the first connecting part 472 and the second connecting part 474. The insulating strut 470 physically connects the restricting member 440 and the heat-dissipating member 480, and electrically insulates these elements from each other.

The first connecting part 472 may be a nut, and the second connecting part 474 may be a stud. The second connecting part 474 of the insulating strut 470 is fixed to the fixing portion 482 of the heat-dissipating member 480. Subsequently, the screws 462 pass the restricting member 440 and are fixed to the insulating strut 470 to fix the restricting member 440 to the insulating strut 470. Though the insulating strut 470 connects and electrically insulates the restricting member 440 and the heat-dissipating member 480 in the embodiment, the restricting member 440 and the heat-dissipating member 480 may be fixed to and electrically insulated from each other by other methods such as fixing by plastic screws or foam adhesives.

The heat-dissipating member 480 may be fixed to the printed circuit board 410 by the insulating strut 490 as well. The second connecting part 492 of the insulating strut 490 is fixed to the fixing portion of the heat-dissipating member 480 (shown in FIG. 5), and then the screws 496 pass the through holes 412 of the printed circuit board 410 and are fixed to the first connecting part 494 of the insulating strut 490. Therefore, the heat-dissipating member 480 is fixed to the printed circuit board 410.

Figure 9:
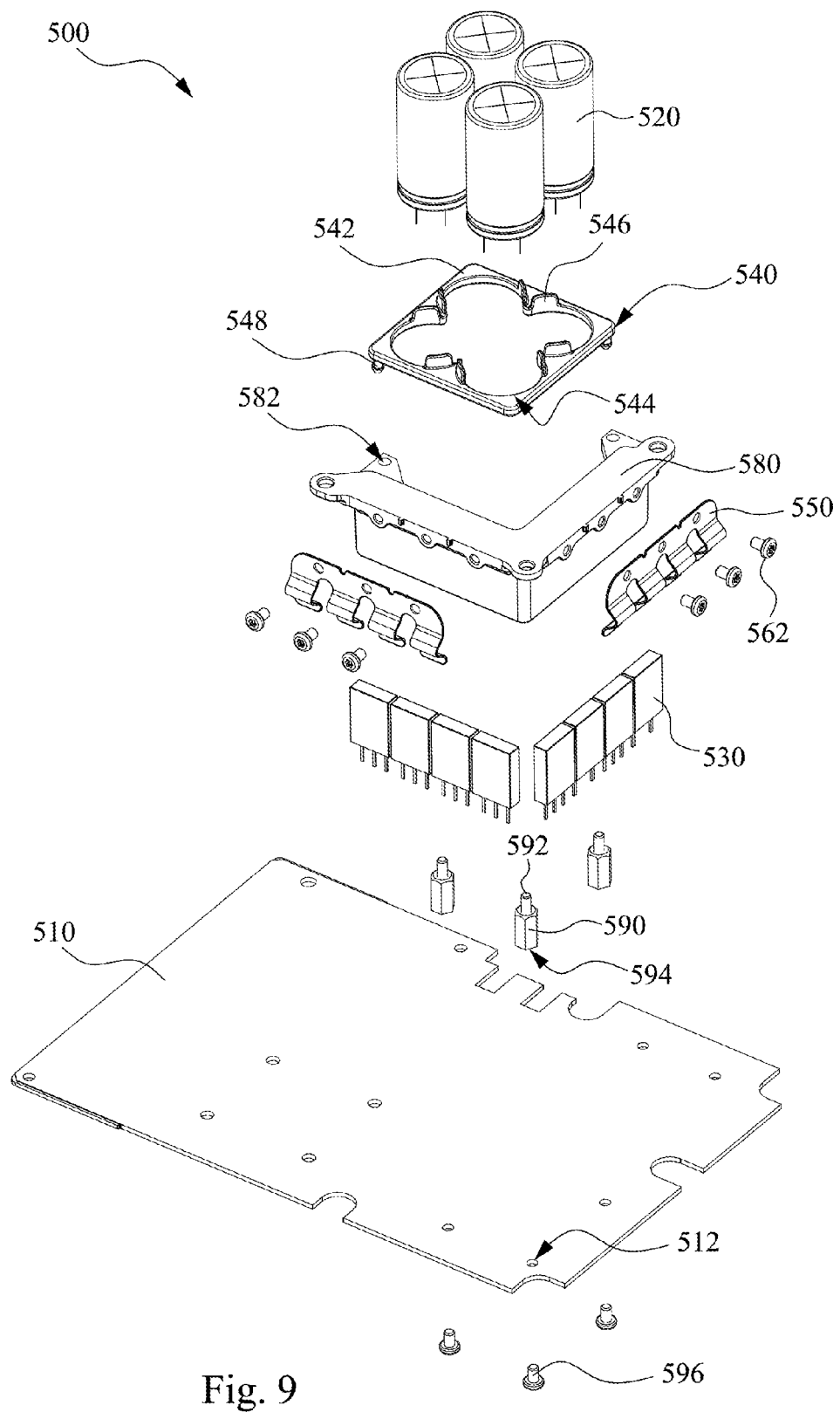
FIG. 9 is an exploded view of the printed wiring board assembly of the power conversion device according to another embodiment of this invention.

FIG. 9 is an exploded view of the printed wiring board assembly 500 of the power conversion device according to another embodiment of this invention. As shown in FIG. 9, the printed wiring board assembly 500 includes the printed circuit board 510, the first electronic components 520 disposed on the printed circuit board 510, the second electronic components 530, the restricting member 540 fixing the first electronic components 520, the heat-dissipating member 580, and the clamping member 550.

The restricting member 540 includes the body 542, the opening 544 disposed in the body 542, and the baffles 546. The clamping member 550 may be fixed to the heat-dissipating member 580 by the screws 562. The first connecting part 592 of the insulating strut 590 is fixed to the heat-dissipating member 580. The screws 596 pass the through holes 512 on the printed circuit board 510 and are fixed to the second connecting part 594 of the insulating strut 590 to fix the heat-dissipating member 580 to the printed circuit board 510.

The material of the restricting member 540 may be plastic, and the restricting member 540 may be fixed to the heat-dissipating member 580 by any methods. For example, the restriction member 540 may have a plurality of coupling portions 548 uprightly disposed on the body 542, the heat-dissipating member 580 may have a plurality of coupling holes 582 corresponding to the coupling portions 548, and the coupling portions 548 are coupled in the coupling holes 582 to fix the restricting member 540 and the heat-dissipating member 580.

In summary, by using the insulating struts or the restriction member to fix the printed wiring board assembly and the grounding member such as the heat-dissipating base or the heat-dissipating member, the electronic insulation of the printed wiring board assembly and the heat-dissipating base is achieved by the insulating struts or the coordination of the restriction member, the insulating struts (or the coupling portions), etc. The first connecting part and the second connecting part are electrically insulated from each other by the plastic part. Therefore, even though electronic components on the printed wiring board assembly is electrically connected to the screws, the electronic components is electrically insulated from the heat-dissipating base as the ground member due to the insulating of the plastic part, and the electronic components may not be damaged due to a short circuit. As a result, the miniature approach may be achieved. In addition, because of the protection of the restriction member, the pin feet of the electronic components connected to the printed wiring board assembly will be well protected. Therefore, the reliability of the power conversion device is improved.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is only one example of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A power conversion device, comprising:
   a printed wiring board assembly, comprising:
   a printed circuit board having a plurality of through holes; and
   a plurality of electronic components disposed on the printed circuit board;
   a grounding member; and
   a plurality of insulating struts corresponding to the through holes and physically connecting and electrically insulating the printed circuit board and the grounding member, wherein each of the insulating struts comprises a first connecting part, a second connecting part, and a plastic part partially covering the first connecting part and the second connecting part, and the first connecting part and the second connecting part are separated by the plastic part.

2. The power conversion device of claim 1, wherein the grounding member comprises a heat-dissipating base, and at least one of insulating struts physically connects and electrically insulates the printed circuit board and the heat-dissipating base.

3. The power conversion device of claim 2, wherein the heat-dissipating base comprises a case and a fluid passage disposed in the case.

4. The power conversion device of claim 2, wherein the heat-dissipating base comprises a case and a fin set disposed in the case.

5. The power conversion device of claim 2, wherein the grounding member further comprises a heat-dissipating member.

6. The power conversion device of claim 5, further comprising:
   a clamping member fixed to the heat-dissipating member, wherein the electronic component is clamped between the heat-dissipating member and the clamping member and is uprightly disposed on the printed circuit board.

7. The power conversion device of claim 5, wherein the heat-dissipating member comprises a plurality of fixing portions, some of the insulating struts fix the printed circuit board to the fixing portions.

8. The power conversion device of claim 5, wherein the heat-dissipating member contacts the heat-dissipating base.

9. The power conversion device of claim 1, wherein the power conversion device is a vehicle power conversion device.

10. A printed wiring board assembly, comprising:
    a printed circuit board;
    a plurality of electronic components disposed on the printed circuit board; and
    a restricting member having a body and an opening disposed in the body, wherein the electronic components are disposed in the opening, and the restricting member comprises a plurality of baffles.

11. The printed wiring board assembly of claim 10, wherein the electronic components are capacitors.

12. The printed wiring board assembly of claim 10, wherein the material of the restricting member is metal or plastic.

13. The printed wiring board assembly of claim 10, wherein every two of the baffles are disposed opposite to each other and on an edge of the opening, and ends of the baffles distant from the body tilt toward a center of the opening.

14. The printed wiring board assembly of claim 10, wherein the printed wiring board assembly is applied to a vehicle power conversion device.

15. A power conversion device, comprising:
    a printed circuit board;
    a plurality of first electronic components disposed on the printed circuit board;
    a restricting member having a body and an opening disposed in the body, and the restricting member comprises a plurality of baffles; and
    a heat-dissipating member fixed to the printed circuit board and electrically insulated from the restricting member.

16. The power conversion device of claim 15, further comprising:
    a clamping member; and
    a plurality of second electronic components disposed on the printed circuit board, wherein the clamping member is fixed to the heat-dissipating member, for fixing the second electronic components, so that the second electronic components are uprightly disposed on the printed circuit board.

17. The power conversion device of claim 16, wherein the first electronic components are capacitors and the second electronic components are power devices.

18. The power conversion device of claim 15, wherein the material of the restricting member is metal or plastic.

19. The power conversion device of claim 15, further comprising a plurality of insulating struts physically connecting and electrically insulating the restricting member and the heat-dissipating member.

20. The power conversion device of claim 15, further comprising:
    a heat-dissipating base; and
    a plurality of insulating struts, for physically connecting and electrically insulating the printed circuit board and the heat-dissipating base.

21. The power conversion device of claim 20, wherein each of the insulating struts comprises a first connecting part, a second connecting part, and a plastic part partially covering the first connecting part and the second connecting part.

22. The power conversion device of claim 20, wherein the heat-dissipating member contacts the heat-dissipating base.

23. The power conversion device of claim 22, wherein the heat-dissipating base comprises a case and a fluid passage disposed in the case.

24. The power conversion device of claim 22, wherein the heat-dissipating base comprises a case and a fin set disposed in the case.

25. The power conversion device of claim 15, further comprising a plurality of insulating struts physically connecting and electrically insulating the printed circuit board and the heat-dissipating member.

26. The power conversion device of claim 25, wherein each of the insulating struts comprises a first connecting part, a second connecting part, and a plastic part partially covering the first connecting part and the second connecting part.

27. The power conversion device of claim 19, wherein each of the insulating struts comprises a first connecting part, a second connecting part, and a plastic part partially covering the first connecting part and the second connecting part.

28. The power conversion device of claim 15, wherein the restricting member further comprises a plurality of coupling portions uprightly disposed on the body, the heat-dissipating member comprises a plurality of coupling holes corresponding to the coupling portions, and the coupling portions are coupled in the coupling holes.

29. The power conversion device of claim 15 wherein every two of the baffles are disposed opposite to each other and on an edge of the opening, and ends of the baffles distant from the body tilt toward a center of the opening.

30. The power conversion device of claim 15, wherein the power conversion device is a vehicle power conversion device.

* * * * *